(12) United States Patent
Kim et al.

(10) Patent No.: US 11,417,572 B2
(45) Date of Patent: Aug. 16, 2022

(54) DROPLET MEASUREMENT METHOD, DROPLET MEASUREMENT APPARATUS, AND METHOD OF MANUFACTURING DISPLAY DEVICE

(71) Applicant: SAMSUNG DISPLAY CO., LTD., Yongin-si (KR)

(72) Inventors: Jongsung Kim, Cheonan-si (KR); Honggi Min, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 138 days.

(21) Appl. No.: 16/820,149

(22) Filed: Mar. 16, 2020

(65) Prior Publication Data

US 2021/0050270 A1   Feb. 18, 2021

(30) Foreign Application Priority Data

Aug. 14, 2019  (KR) ........................ 10-2019-0099271

(51) Int. Cl.
*H01L 21/66*  (2006.01)
*H01L 51/00*  (2006.01)
*H01L 51/56*  (2006.01)

(52) U.S. Cl.
CPC .......... *H01L 22/12* (2013.01); *H01L 51/0005* (2013.01); *H01L 51/56* (2013.01)

(58) Field of Classification Search
CPC ...... H01L 51/0005; H01L 51/56; H01L 22/12
See application file for complete search history.

(56) References Cited

U.S. PATENT DOCUMENTS

| 2005/0122363 | A1* | 6/2005 | Koyama | B41J 2/0456 347/19 |
| 2007/0160772 | A1* | 7/2007 | Morimoto | H01L 51/0005 427/466 |
| 2010/0020122 | A1* | 1/2010 | Lee | H05K 3/125 347/19 |
| 2015/0373305 | A1* | 12/2015 | Hauf | B41J 2/195 427/8 |
| 2018/0283856 | A1* | 10/2018 | Suemasu | B41M 5/0064 |
| 2019/0157559 | A1* | 5/2019 | Hiruoka | B05D 1/26 |

FOREIGN PATENT DOCUMENTS

| JP | 5381778 | 10/2013 |
| KR | 10-1073976 | 10/2011 |
| KR | 10-2012-0098007 | 9/2012 |
| KR | 10-2017-0051466 | 5/2017 |
| KR | 10-1818695 | 1/2018 |

* cited by examiner

*Primary Examiner* — Shaun M Campbell
(74) *Attorney, Agent, or Firm* — F. Chau & Associates, LLC

(57) ABSTRACT

A droplet measurement method is described. The droplet measurement method may include discharging a droplet on a substrate, scanning the droplet by moving a scanning unit, and calculating a volume of the droplet by using the thicknesses of the portions of the droplet. The scanning unit may include optical scanners arranged in multiple directions, storing thicknesses of portions of the droplet scanned by the scanning unit.

18 Claims, 16 Drawing Sheets

DROPLET MEASUREMENT METHOD, DROPLET MEASUREMENT APPARATUS, AND METHOD OF MANUFACTURING DISPLAY DEVICE

CROSS-REFERENCE TO RELATED APPLICATION(S)

This application claims priority under 35 USC § 119 to Korean Patent Application No. 10-2019-0099271 filed on Aug. 14, 2019 in the Korean Intellectual Property Office (KIPO), the entire disclosure of which is incorporated by reference herein.

BACKGROUND

1. Field

Embodiments of the present disclosure relate to droplet measurement. More particularly, embodiments relate to a method of measuring a volume of a droplet, a droplet measurement apparatus used in the method, and a method of manufacturing a display device using the method.

2. Description of the Related Art

Electronic devices such as televisions, mobile devices, and computers use display devices to visualize information for a user. A display device may include a plurality of pixels for displaying the information. Liquid crystal displays (LCD) and organic light-emitting diode (OLED) are examples of display devices used in electronic devices.

The light-emitting layer of an OLED may be formed using various manufacturing processes, including photolithography and inkjet printing. For example, light-emitting layer may be formed with an inkjet printing process by applying a liquid droplet on a pixel electrode that is exposed by a small opening in a substrate. The liquid droplet includes the material to form the light-emitting layer.

During an inkjet printing process, the volume of the droplets may be inconsistent, causing possible height differences in light-emitting layers. The height differences may appear as a stain, irregularity, or discoloration on the display device. Therefore, there is a need in the art for a method and apparatus to accurately measure the volume of a droplet on a substrate.

SUMMARY

Embodiments provide a droplet measurement method for accurately measuring a volume of a droplet.

Embodiments provide a droplet measurement apparatus used in the droplet measurement method.

Embodiments provide a method of manufacturing a display device using the droplet measurement method.

A droplet measurement method according to embodiments may include discharging a droplet on a substrate, scanning the droplet by moving a scanning unit, which includes optical scanners arranged in a first direction, in a second direction different from the first direction, storing one or more thicknesses of portions of the droplet scanned by the scanning unit, and calculating a volume of the droplet based on the one or more thicknesses of the portions of the droplet.

In an embodiment, the scanning of the droplet may include emitting light to the droplet by each of the optical scanners and measuring the thicknesses of the portions of the droplet by receiving the light reflected from the droplet by each of the optical scanners.

In an embodiment, the calculating of the volume of the droplet includes calculating a sectional area of the droplet through a mensuration by parts by using the thicknesses of the portions of the droplet, which are arranged in the first direction and calculating the volume of the droplet through the mensuration by parts by using areas of sections of the droplet, which are arranged in the second direction.

In an embodiment, the first direction may be orthogonal to the second direction. In an embodiment, the first direction may forms an acute angle with respect to the second direction. In an embodiment, an angle between the first direction and the second direction may be about 5 degrees or more and less than about 90 degrees. In an embodiment, a scanning resolution of the scanning unit in the second direction may be adjusted by a moving speed of the scanning unit in the second direction and a scanning frequency of the scanning unit.

A droplet measurement apparatus according to embodiments may include a stage configured to support a substrate, a droplet discharge unit disposed on the stage to discharge a droplet on the substrate, a scanning unit disposed on the stage and including optical scanners arranged in a first direction to scan the droplet while moving in a second direction different from the first direction, a storage unit configured to store one or more thicknesses of portions of the droplet scanned by the scanning unit, and a calculation unit configured to calculate a volume of the droplet based on the one or more thicknesses of the portions of the droplet.

In an embodiment, the first direction may be orthogonal to the second direction. In an embodiment, the first direction may form an acute angle with respect to the second direction. In an embodiment, an angle between the first direction and the second direction may be about 5 degrees or more and less than about 90 degrees. In an embodiment, an interval between adjacent optical scanners of the scanning unit may be uniform.

In an embodiment, each of the optical scanners may include a light source configured to emit light to the droplet and an optical sensor configured to receive the light reflected from the droplet. In an embodiment, the droplet discharge unit may move in the second direction to discharge the droplet. In an embodiment, the droplet discharge unit may include nozzles arranged in a third direction orthogonal to the second direction to respectively discharge the droplet.

A method of manufacturing a display device according to embodiments may include discharging a droplet on a substrate, scanning the droplet by moving a scanning unit, which includes optical scanners arranged in a first direction, in a second direction different from the first direction, storing one or more thicknesses of portions of the droplet scanned by the scanning unit, calculating a volume of the droplet based on the one or more thicknesses of the portions of the droplet, adjusting a discharge amount of the droplet, and forming a light-emitting layer by discharging the droplet onto a display substrate.

In an embodiment, the scanning of the droplet may include emitting light to the droplet by each of the optical scanners and measuring the thicknesses of the portions of the droplet by receiving the light reflected from the droplet by each of the optical scanners.

In an embodiment, the calculating of the volume of the droplet may include calculating a sectional area of the droplet through a mensuration by parts by using the thicknesses of the portions of the droplet, which are arranged in the first direction and calculating the volume of the droplet through the mensuration by parts by using areas of sections of the droplet, which are arranged in the second direction.

In an embodiment, the droplet may include at least one of a hole injection material, a hole transport material, an organic light-emitting material, an electron transport material, and an electron injection material. In an embodiment, the display substrate may include a pixel electrode and a pixel defining layer including an opening formed on the pixel electrode to expose at least a portion of the pixel electrode. The droplet may be discharged in the opening on the pixel electrode.

In the droplet measurement method, the droplet measurement apparatus used in the droplet measurement method, and the method of manufacturing the display device using the droplet measurement method according to the embodiments, the droplet may be scanned by moving the scanning unit, which includes the optical scanners arranged in the first direction, in the second direction different from the first direction, and the volume of the droplet may be calculated by using the thicknesses of the portions of the droplet, so that the volume of the droplet may be accurately measured. Further, the discharge amount of the droplet may be adjusted based on the measured volume of the droplet, so that the light-emitting layer of the display device with a uniform volume may be formed.

According to another embodiment, a droplet measurement method is described comprising emitting a signal toward a droplet on a substrate; receiving a reflected signal from based on the emitted signal; measuring a thickness of at least one portion of the droplet based on the reflected signal; and calculating a volume of the droplet based on the thickness of the at least one portion of the droplet.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

The present disclosure relates to systems and methods for measuring droplets. In a conventional droplet measurement method, the volume of a droplet may be calculated by using a bottom surface of the droplet, or a radius and a contact angle of the droplet. However, using a two-dimensional image is analyzed based on the bottom surface of the droplet may result in measurement errors such as a difference between the calculated volume of the droplet and the actual volume of the droplet. Further, if the outer surface of the droplet is assumed to be smooth when using the radius and the contact angle of the droplet, an error between the calculated volume of the droplet and an actual volume of the droplet may result.

Thus, in a droplet measurement method according to the present disclosure, droplet measurements may be made based on the thickness of the droplet. Specifically, A droplet is scanned by moving a scanning unit that includes one or more optical scanners, and moves in a direction perpendicular to the arrangement of the scanners. The scanning unit measures the thickness of droplets, and volume of the droplets is then calculated (e.g., through a mensuration by parts by using the thicknesses of portions of the droplet scanned by the scanning unit). Therefore, the volume of the droplet may be measured accurately.

Hereinafter, droplet measurement methods, droplet measurement apparatuses, and methods of manufacturing a display device in accordance with embodiments will be explained in detail with reference to the accompanying drawings.

Hereinafter, a droplet measurement apparatus and a droplet measurement method using the same, according to an example embodiment of the present disclosure, will be described with reference to FIGS. 1 to 11.

Figure 1:
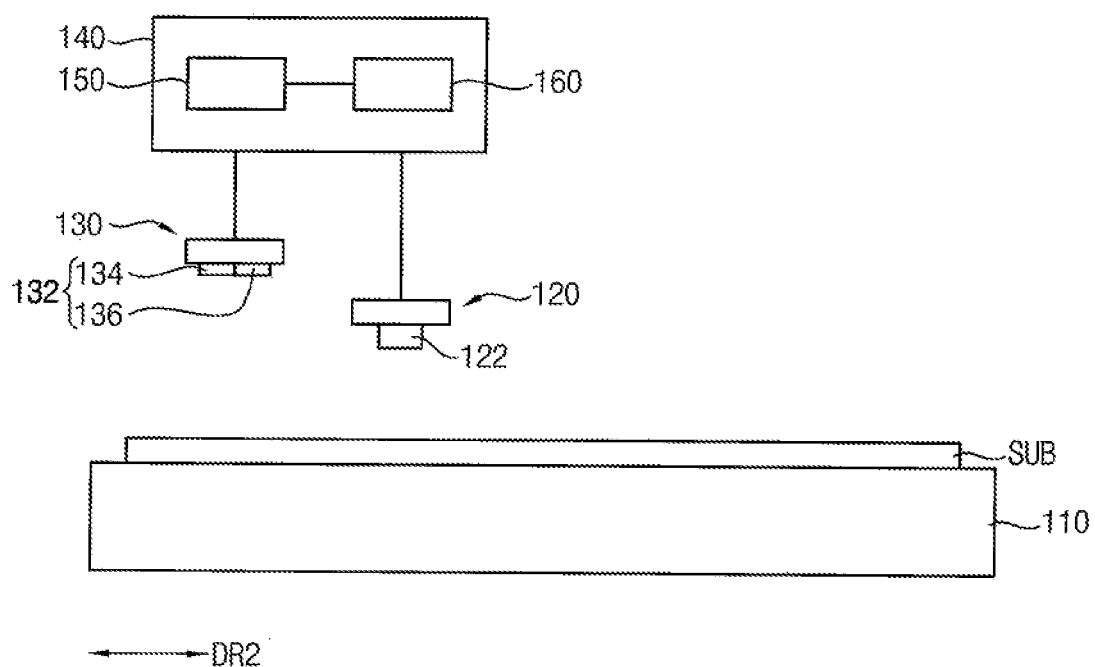
FIG. 1 is a view showing a droplet measurement apparatus according to an example embodiment of the present invention.
Figure 2:
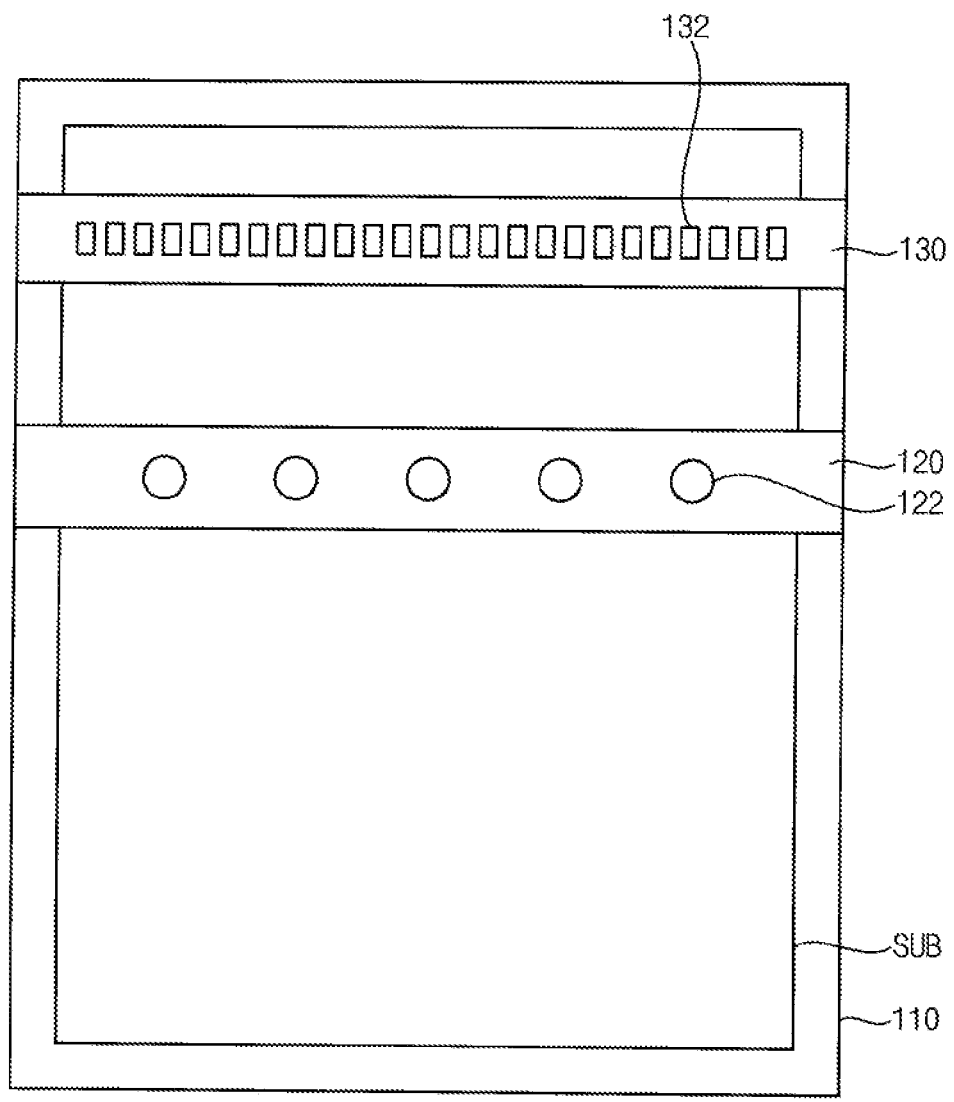
FIG. 2 is a plan view showing the droplet measurement apparatus according to an example embodiment of the present disclosure.
Figure 2:
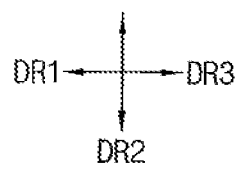

FIG. 1 is a view showing a droplet measurement apparatus, according to an example embodiment of the present disclosure. FIG. 2 is a plan view showing the droplet measurement apparatus, according to an example embodiment of the present disclosure.

Referring to FIGS. 1 and 2, the droplet measurement apparatus, according to an example embodiment of the present disclosure, may include a stage 110, a droplet discharge unit 120, a scanning unit 130, a control unit 140, a storage unit 150, and a calculation unit 160.

A substrate SUB may be disposed on the stage 110. The stage 110 may support the substrate SUB. Additionally, the substrate SUB may provide a space on which a droplet is discharged and may be an insulating substrate. The insulating substrate may include materials such as glass, quartz, plastic, or the like.

The droplet discharge unit 120 may be disposed on the stage 110. The droplet discharge unit 120 may discharge the droplet on the substrate SUB. The droplet discharge unit 120 may discharge the droplet at a predetermined position on the substrate SUB while moving in a second direction DR2.

The droplet discharge unit 120 may include a plurality of nozzles 122. Droplets may be discharged onto the substrate SUB through the nozzles 122. Accordingly, the nozzles 122 may be arranged in a third direction DR3. The third direction DR3 may be substantially orthogonal to the second direction DR2. In an example embodiment, an interval between adjacent nozzles 122 may be substantially uniform. In this case, an interval between adjacent droplets discharged onto the substrate SUB may be substantially uniform.

The droplet discharged from the droplet discharge unit 120 may be a material that forms a light-emitting layer of an organic light-emitting element. In an example embodiment, the droplet may include at least one of a hole injection material, a hole transport material, and an organic light-emitting material. Additionally, the droplet may include at least one of an electron transport material and an electron injection material. The organic light-emitting material may include a red organic light-emitting material, a green organic light-emitting material, and/or a blue organic light-emitting material. The droplet may include a solvent for allowing the materials to be smoothly discharged from the nozzle 122 in addition to the materials.

The scanning unit 130 may be disposed on the stage 110. The scanning unit 130 may scan the droplet disposed on the substrate SUB. The scanning unit 130 may scan the droplet discharged at the predetermined position on the substrate SUB while moving in the second direction DR2.

The scanning unit 130 may move in the second direction DR2 at a predetermined speed. In addition, the scanning unit 130 may scan the droplet at a predetermined scanning frequency. In this case, a scanning resolution of the scanning unit 130 in the second direction DR2 may be adjusted by the moving speed of the scanning unit 130 in the second direction DR2 and the scanning frequency of the scanning unit 130. For example, the scanning resolution of the scanning unit 130 in the second direction DR2 may be proportional to the scanning frequency of the scanning unit 130. Additionally, the scanning resolution of the scanning unit 130 in the second direction DR2 may be inversely proportional to the moving speed of the scanning unit 130 in the second direction DR2.

The scanning unit 130 may include optical scanners 132. The scanning unit 130 may scan the droplet through the optical scanners 132. The optical scanners 132 may be arranged in a first direction DR1, which may be different from the second direction DR2. The first direction DR1 may be substantially orthogonal to the second direction DR2. In other words, the first direction DR1 may be substantially the same as the third direction DR3. In this case, the optical scanners 132 may be arranged in substantially the same direction as the arrangement direction of the nozzles 122.

In an example embodiment, an interval between adjacent optical scanners 132 may be substantially uniform. In this case, the scanning resolution of the scanning unit 130 in the first direction DR1 may be determined by the interval between the adjacent optical scanners 132. For example, the scanning resolution of the scanning unit 130 in the first direction DR1 may be inversely proportional to the interval between the adjacent optical scanners 132.

Each of the optical scanners 132 may include a light source 134 and an optical sensor 136. The light source 134 may emit light to the droplet. The optical sensor 136 may receive the light reflected from the droplet. In an example embodiment, the light emitted from the light source 134 may be visible light, a laser, or the like. As the optical sensor 136 receives the light emitted from the light source 134 and reflects the light from a surface of the droplet, each of the optical scanners 132 may measure a thickness of a portion of the droplet. Meanwhile, as the scanning unit scans the droplet at the predetermined scanning frequency while moving in the second direction DR2 at the predetermined speed, the scanning unit 130 may measure one or more thicknesses of portions of the droplet. The scanning unit 130 may include the optical scanners 132 arranged in the first direction DR1.

The control unit 140 may control the droplet discharge unit 120 and the scanning unit 130. For example, the control unit 140 may control movement, droplet discharge operation, and the like of the droplet discharge unit 120. Additionally, the control unit 140 may control movement, moving speed, scanning frequency, and the like of the scanning unit 130.

The storage unit 150 may store the thicknesses of the portions of the droplet scanned by the scanning unit 130. The calculation unit 160 may calculate a volume of the droplet based on the one or more thicknesses of the portions of the droplet. Although the control unit 140 is shown in FIG. 1 as including the storage unit 150 and the calculation unit 160, the present invention is not limited thereto. Therefore, the storage unit 150 and the calculation unit 160 may be separated from the control unit 140.

Figure 3:
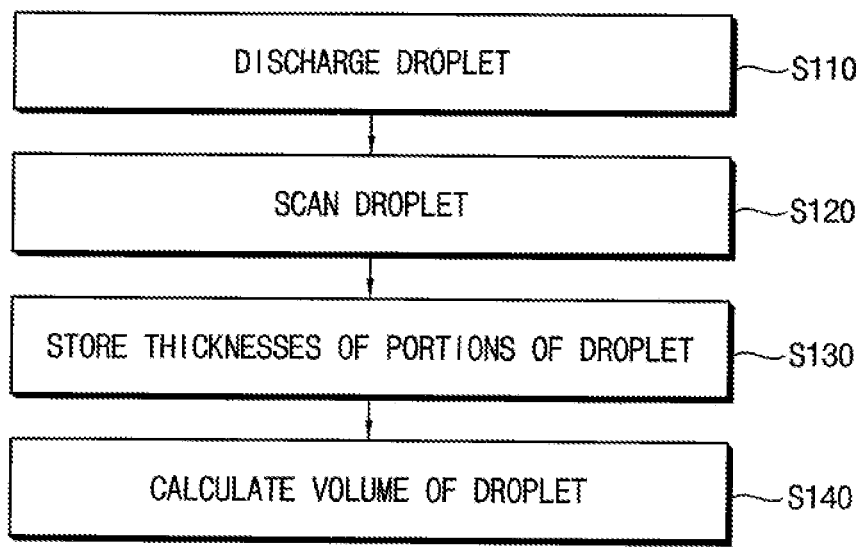
FIG. 3 is a flowchart showing a droplet measurement method according to an example embodiment of the present disclosure.

FIG. 3 is a flowchart showing a droplet measurement method, according to an example embodiment of the present disclosure.

Referring to FIG. 3, the droplet measurement method, according to an example embodiment of the present disclosure, may include a method of discharging a droplet (S110), scanning the droplet (S120), storing one or more thicknesses of portions of the droplet (S130), and calculating a volume of the droplet (S140).

According to one embodiment, measuring the droplet may include emitting a signal (e.g., visible light, an electromagnetic, or sonic signal) toward a droplet on a substrate; receiving a reflected signal from based on the emitted signal; measuring a thickness of at least one portion of the droplet based on the reflected signal; and calculating a volume of the droplet based on the thickness of the at least one portion of the droplet.

In some cases, calculating the volume of the droplet may also depend on other measurements such as a bottom surface area, a radius, or a width of the droplet. These measurements may be made separately or during the same scanning process as the measurement of the thickness of the droplet.

Figure 4:
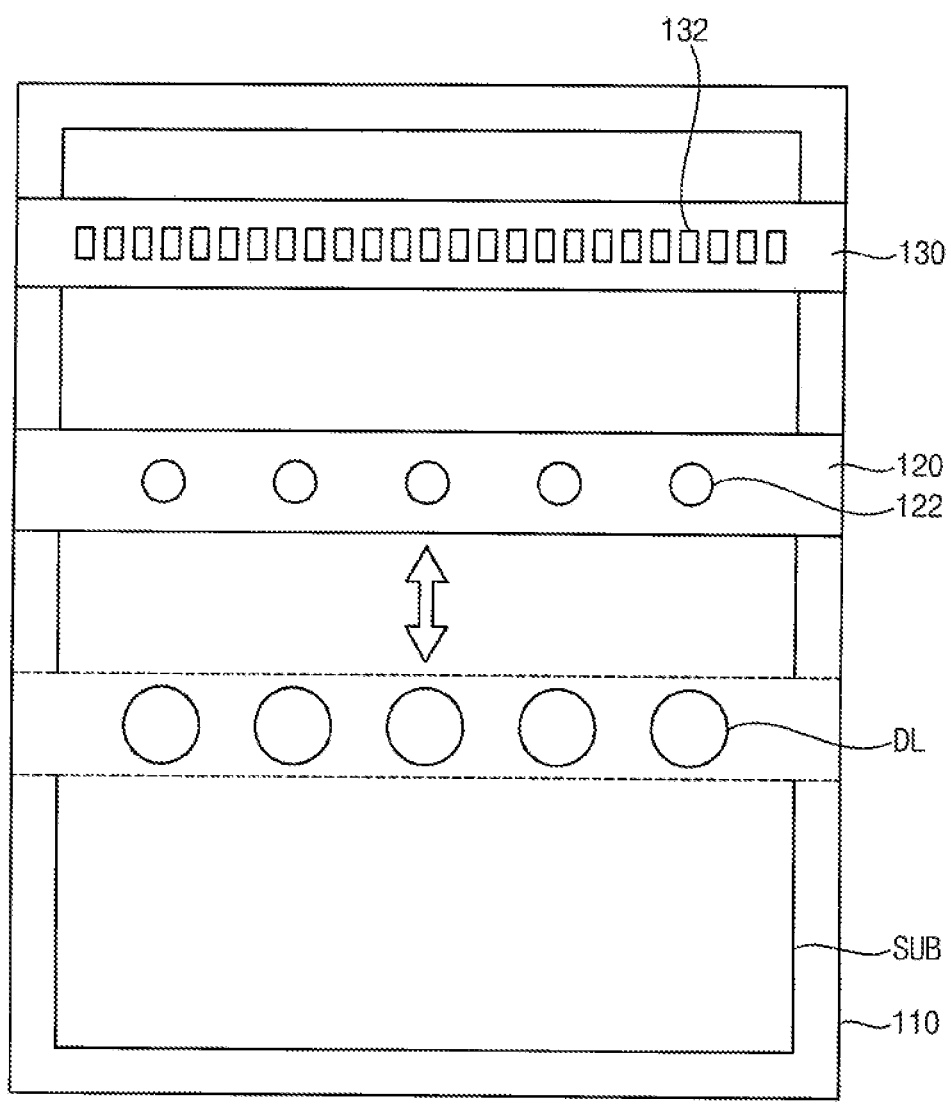
FIG. 4 is a plan view showing discharging of a droplet according to an example embodiment of the present disclosure.

FIG. 4 is a plan view showing discharging of a droplet (S110), according to an example embodiment of the present disclosure.

Referring to FIGS. 3 and 4, in the step of discharging of the droplet (S110), the droplet discharge unit 120 may be moved in the second direction DR2 to discharge droplets DL at the predetermined position on the substrate SUB. The droplets DL may be discharged from the nozzles 122 of the droplet discharge unit 120, respectively. The droplets DL may be arranged at a substantially uniform interval in the third direction DR3 at the predetermined position in the second direction DR2. As an example, each of the droplets DL discharged onto the substrate SUB may have a substantially hemispherical shape.

Figure 5:
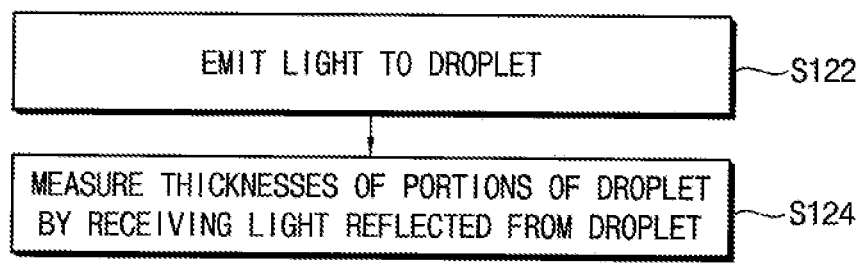
FIG. 5 is a flowchart showing scanning of the droplet according to an example embodiment of the present disclosure.

FIG. 5 is a flowchart showing scanning of the droplet (S120), according to an example embodiment of the present disclosure.

Referring to FIGS. 3 and 5, in the step of scanning the droplet (S120), according to an example embodiment of the present disclosure, the scanning of the droplet may include emitting light to the droplet (S122) and measuring one or more thicknesses of portions of the droplet. Measuring thicknesses of portions of the droplet may be determined by receiving the light reflected from the droplet (S124).

Figure 6:
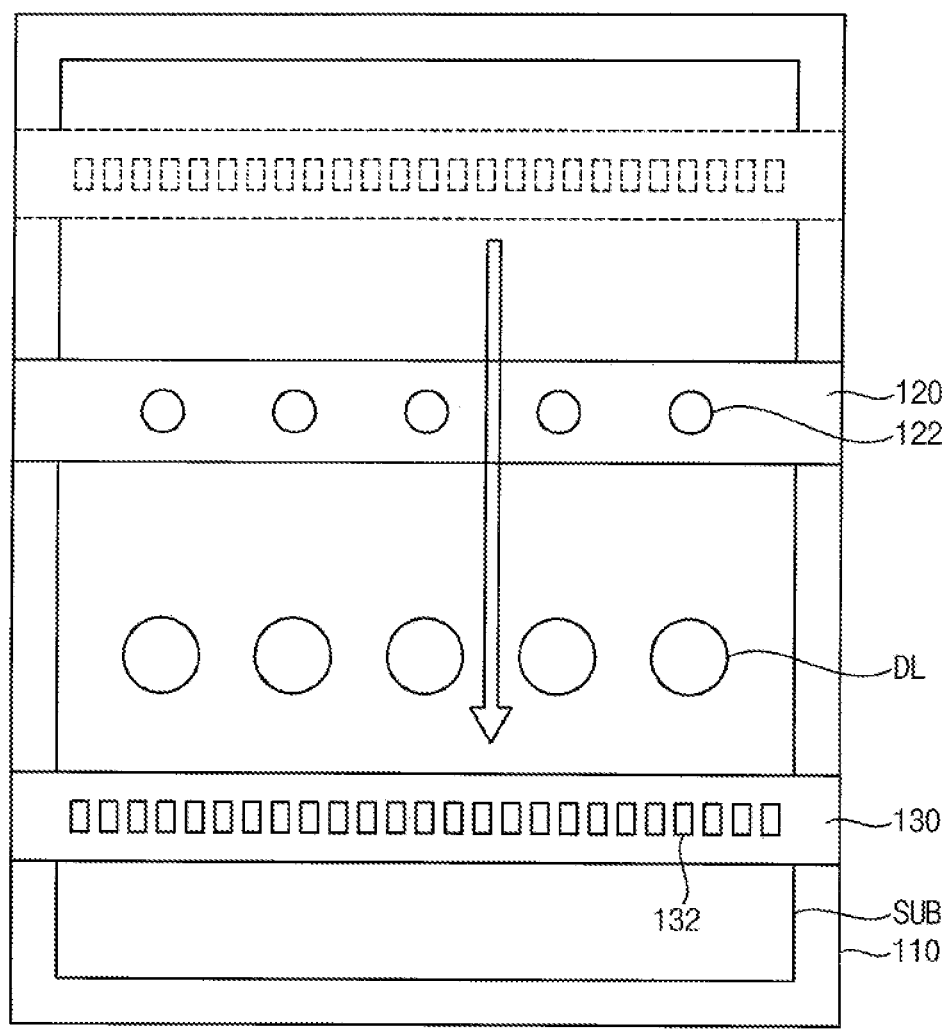
FIGS. 6, 7, and 8 are views showing the scanning of the droplet according to an example embodiment of the present disclosure.
Figure 6:
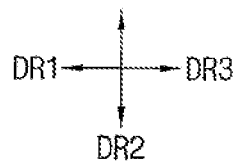
Figure 7:
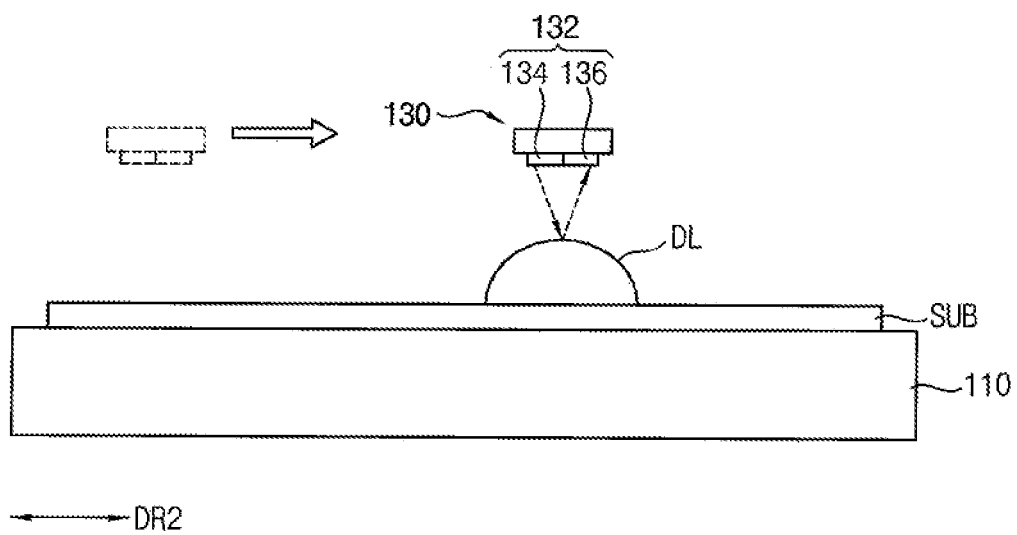
Figure 8:
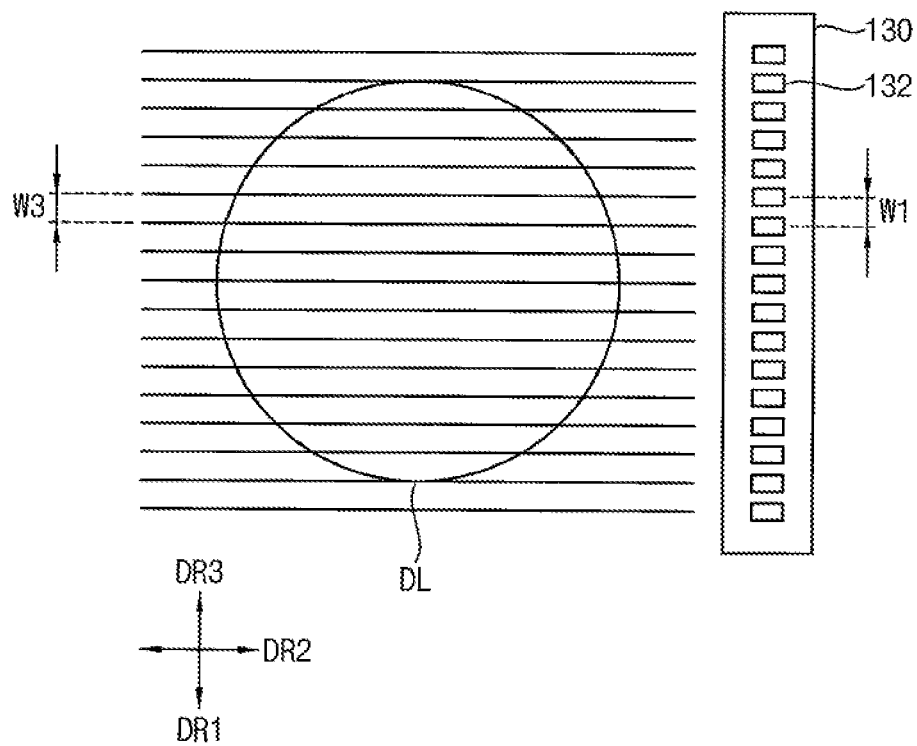

FIGS. 6, 7, and 8 are views showing the scanning of the droplet (S120), according to an example embodiment of the present disclosure.

Referring to FIGS. 3, 5, 6, 7, and 8, in the step of scanning the droplet (S120), the droplets DL may be scanned by moving the scanning unit 130. The scanning unit 130 may include the optical scanners 132 arranged in the first direction DR1, and may move in the second direction DR2.

In the emitting of the light to the droplet (S122), the optical scanners 132 may emit light LT to the droplets DL. The light source 134 of each of the optical scanners 132 may emit the light LT such as visible light and a laser to the droplet DL. In this case, the light LT may be emitted from the optical scanners 132 to one droplet DL. In other words, the interval between the adjacent optical scanners 132 may be smaller than a diameter of the droplet DL.

In the measuring of the thicknesses of the portions of the droplet by receiving the light reflected from the droplet (S124), the optical scanners 132 may receive the light LT reflected from surfaces of the droplets DL. Additionally, the optical scanners 132 may measure the thicknesses of the portions of the droplet DL by using the reflected light LT. The optical sensor 136 of each of the optical scanners 132 may sense the light LT reflected from the surface of the droplet DL. The optical scanner 132 may measure the thickness of each of the portions of the droplet DL by using a time from a time point when the optical scanner 132 emits the light LT to a time point when the optical scanner 132 receives the light LT. For example, the time from the time point when the optical scanner 132 emits the light LT to the time point when the optical scanner 132 receives the light LT may be inversely proportional to the thickness of each of the portions of the droplet DL. The optical scanners 132 arranged in the first direction DR1 may scan the portions of the droplet DL while moving in the second direction DR2, so that the scanning unit 130 may measure the thicknesses of the portions of the droplet DL.

In an example embodiment, the optical scanners 132 of the scanning unit 130 may be arranged in the first direction DR1, which is substantially orthogonal to the second direction DR2. An interval W1 between adjacent optical scanners 132 may be about 5 µm. In this case, a scanning interval W3 in the third direction DR3, which is substantially orthogonal to the second direction DR2, may be about 5 µm. A scanning resolution in the third direction DR3 may be about 14 when the diameter of the droplet DL is about 70 µm. In other words, about 14 optical scanners 132 may scan one droplet DL. In addition, the scanning unit 130 may move in the second direction DR2, and a scanning interval in the second direction DR2 may be about 250 nm. In this case, a scanning resolution in the second direction DR2 may be about 280 when the diameter of the droplet DL is about 70 µm. In other words, each of the optical scanners 132 may scan one droplet DL about 280 times. Accordingly, in the present embodiment, the optical scanners 132 may scan one droplet DL at a scanning resolution of about 3920. That is, the scanning unit 130 may measure thicknesses of about 3920 portions of the droplet DL.

Referring to FIG. 3, in the step of storing the thicknesses of the portions of the droplet (S130), the storage unit may store the thicknesses of the portions of the droplet scanned by the scanning unit 130.

Figure 9:
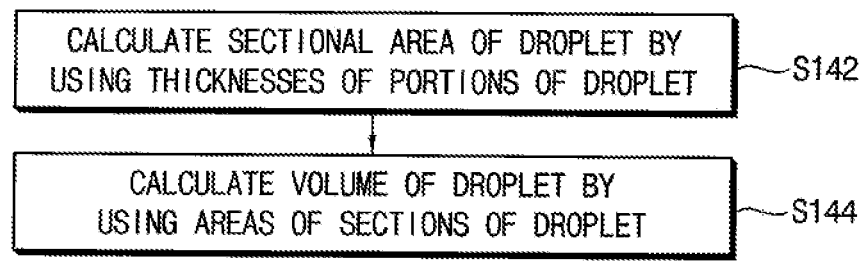
FIG. 9 is a flowchart showing calculating of a volume of the droplet according to an example embodiment of the present disclosure.

FIG. 9 is a flowchart showing calculating a volume of the droplet (S140), according to an example embodiment of the present disclosure.

Referring to FIGS. 3 and 9, in the step of calculating the volume of the droplet (S140), according to an example embodiment of the present disclosure, may include calculating a sectional area of the droplet. Calculating a sectional area of the droplet may be determined by using the thicknesses of the portions of the droplet (S142) and calculating the volume of the droplet by using areas of sections of the droplet (S144).

Figure 10:
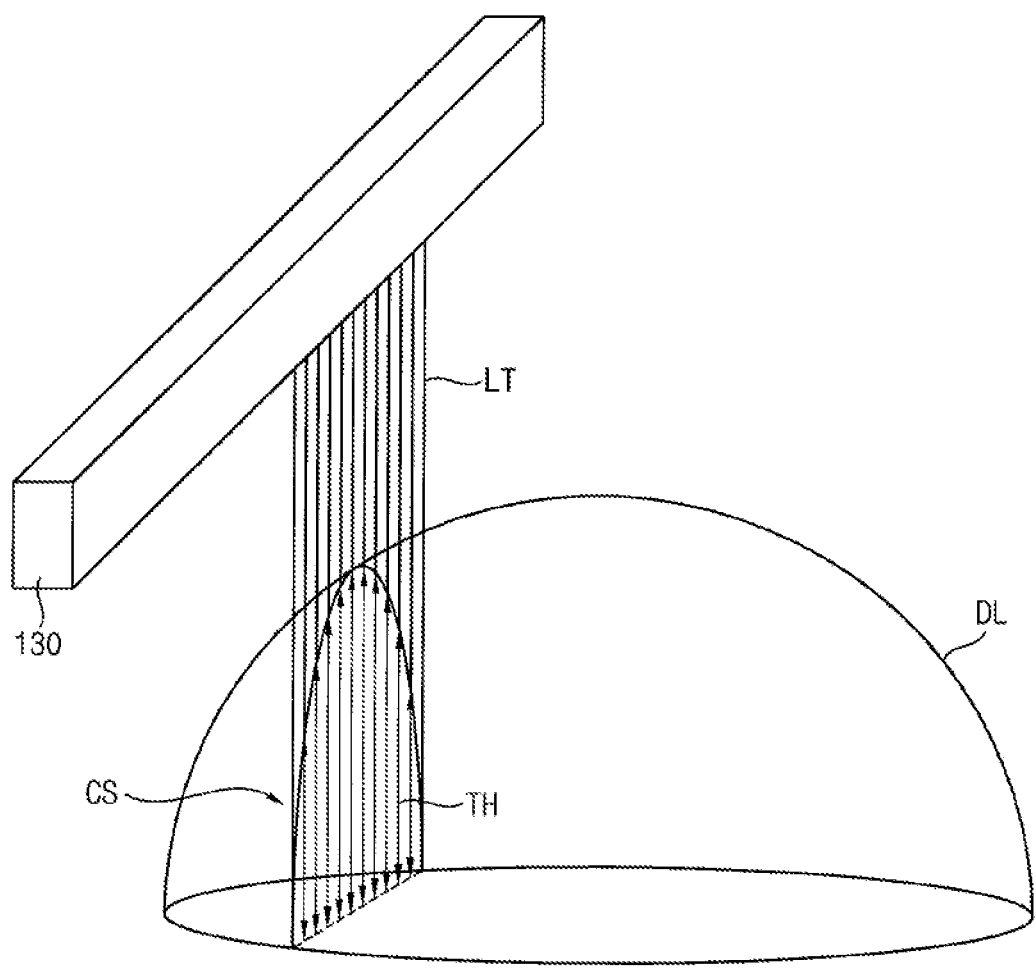
FIGS. 10 and 11 are views showing the calculating of the volume of the droplet (S140) according to an example embodiment.
Figure 11:
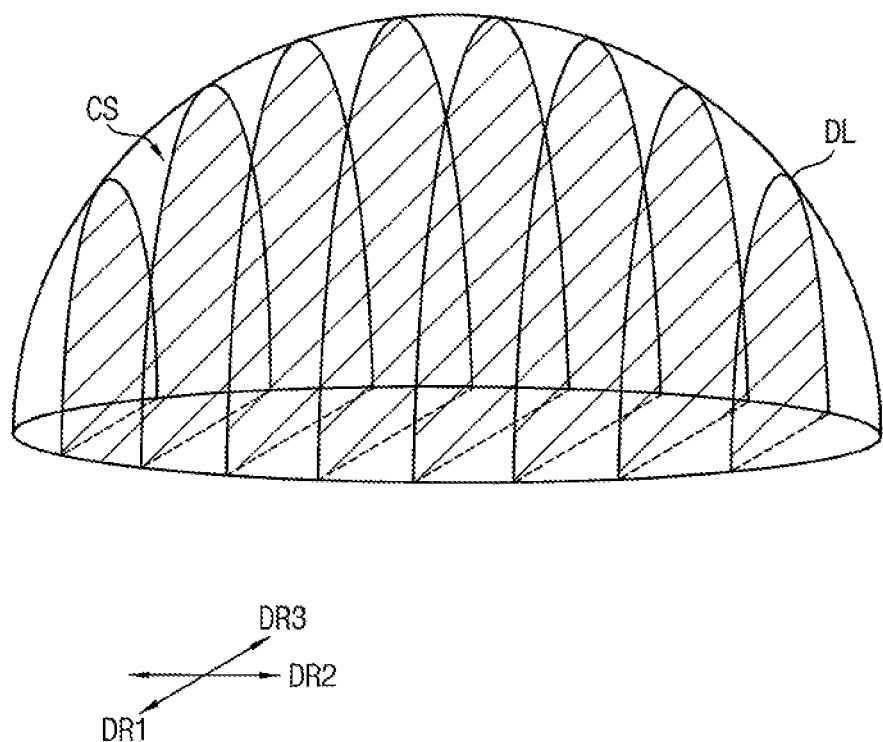

FIGS. 10 and 11 are views showing the calculating of the volume of the droplet (S140), according to an example embodiment of the present disclosure.

Referring to FIGS. 3, 9, 10, and 11, in the step of calculating the volume of the droplet (S140), the calculation unit may calculate the volume of the droplet DL by using thicknesses TH of the portions of the droplet DL. The thicknesses TH of the portions of the droplet DL may be stored in the storage unit.

In the step of calculating the sectional area of the droplet by using the thicknesses of the portions of the droplet (S142), the calculation unit may calculate areas of sections CS of the droplet DL by using the thicknesses TH of the portions of the droplet DL. The thicknesses TH of the portions of the droplet DL may be stored in the storage unit. The area of each of the section CS of the droplet DL may be calculated through a mensuration by parts by using the thicknesses TH of the portions of the droplet DL arranged in the third direction DR3. For example, an area of a rectangle with a bottom side corresponding to a scanning interval in the third direction DR3 and a height corresponding to the thickness TH of each of the portions of the droplet DL which are arranged in the third direction DR3 may be calculated. Therefore, the area of each of the sections CS of the droplet DL may be calculated by adding areas of rectangles arranged in the third direction DR3.

In the step of calculating the volume of the droplet by using the areas of the sections of the droplet (S144), the calculation unit may calculate the volume of the droplet DL by using the calculated areas of the sections CS of the droplet DL. The volume of the droplet DL may be calculated through a mensuration by parts by using the areas of the sections CS of the droplet DL arranged in the second direction DR2. For example, a volume of a three-dimensional structure, with a bottom surface corresponding to the area of each of the sections CS of the droplet DL arranged in the second direction DR2 and a height corresponding to the scanning interval in the second direction DR2, may be calculated. Therefore, the volume of the droplet DL may be calculated by adding volumes of three-dimensional structures arranged in the second direction DR2.

In a comparative example, according to the related art, the volume of the droplet may be calculated by using a bottom surface of the droplet or a radius and a contact angle of the droplet. In this case, there may be an error between the calculated volume of the droplet and an actual volume of the droplet. However, in an example embodiment of the present disclosure, the droplet DL is scanned by moving the scanning unit 130, which includes the optical scanners 132 arranged in the first direction DR1, in the second direction DR2 different from the first direction DR1. Therefore, the volume of the droplet DL is calculated by using the thicknesses of the portions of the droplet DL scanned by the scanning unit 130. This process in the present disclosure provides an accurate measurement of the volume of the droplet.

Hereinafter, a droplet measurement apparatus and a droplet measurement method using the same, according to an example embodiment of the present disclosure, will be described with reference to FIGS. 12 and 13. The droplet measurement apparatus and the droplet measurement method which will be described with reference to FIGS. 12 and 13 may be substantially identical or similar to the droplet measurement apparatus and the droplet measurement method described with reference to FIGS. 1 to 11 except for an arrangement direction of the optical scanners 132 of the scanning unit 130. Accordingly, descriptions of contents substantially identical or similar to the contents described above will be omitted.

Figure 12:
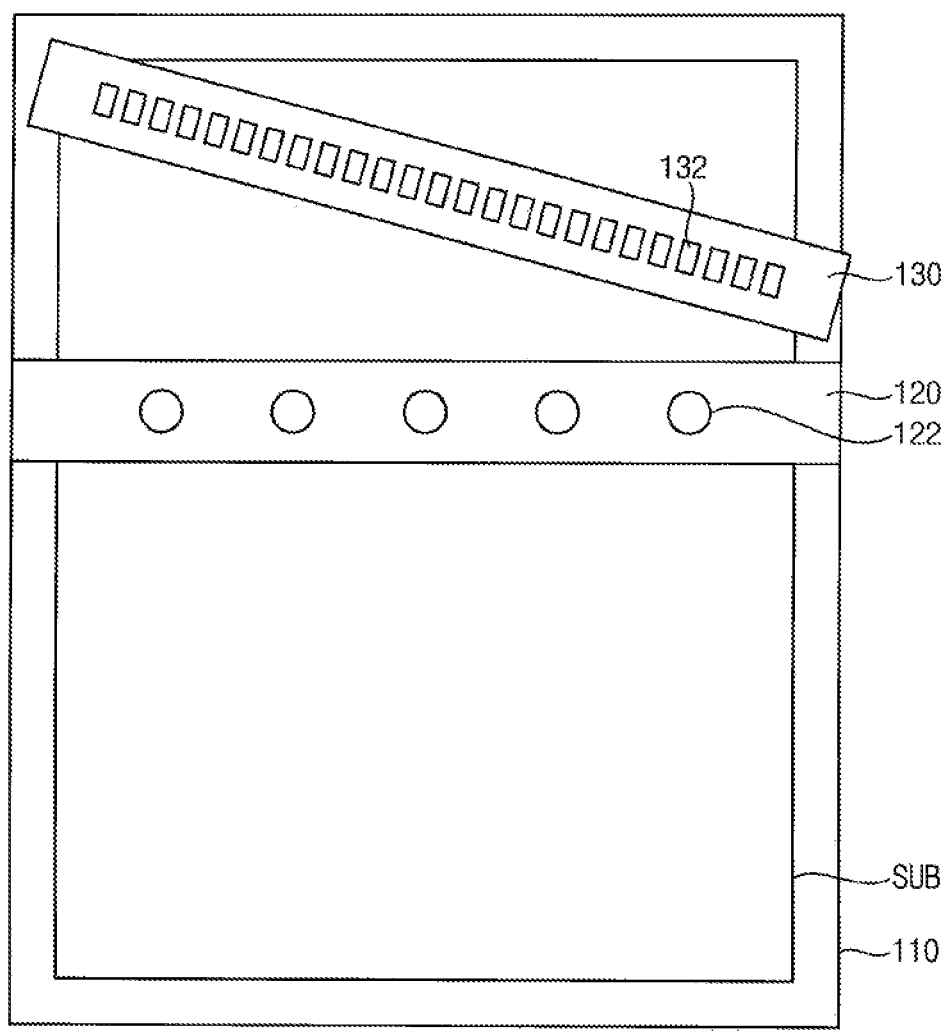
FIG. 12 is a plan view showing a droplet measurement apparatus according to an example embodiment of the present disclosure.

FIG. 12 is a plan view showing a droplet measurement apparatus, according to an example embodiment of the present disclosure.

Referring to FIG. 12, the scanning unit 130 may include the optical scanners 132. The scanning unit 130 may scan the droplet through the optical scanners 132. The optical scanners 132 may be arranged in the first direction DR1, which is different from the second direction DR2. Therefore, the first direction DR1 may form an angle with respect to the second direction DR2. For example, the first direction DR1 may form a perpendicular angle or an acute angle with respect to the second direction DR2. In other words, the first direction DR1 may be different from the third direction DR3 and the optical scanners 132 may be arranged in a direction different from the arrangement direction of the nozzles 122. In an example embodiment, an angle between the first direction DR1 and the second direction DR2 may be about 5 degrees or more and less than about 90 degrees. When the angle between the first direction DR1 and the second direction DR2 is less than about 5 degrees, the scanning interval in the third direction DR3 which is substantially orthogonal to the second direction DR2 becomes too small, so that the scanning unit 130 may not scan an entire surface of the droplet.

Figure 13:
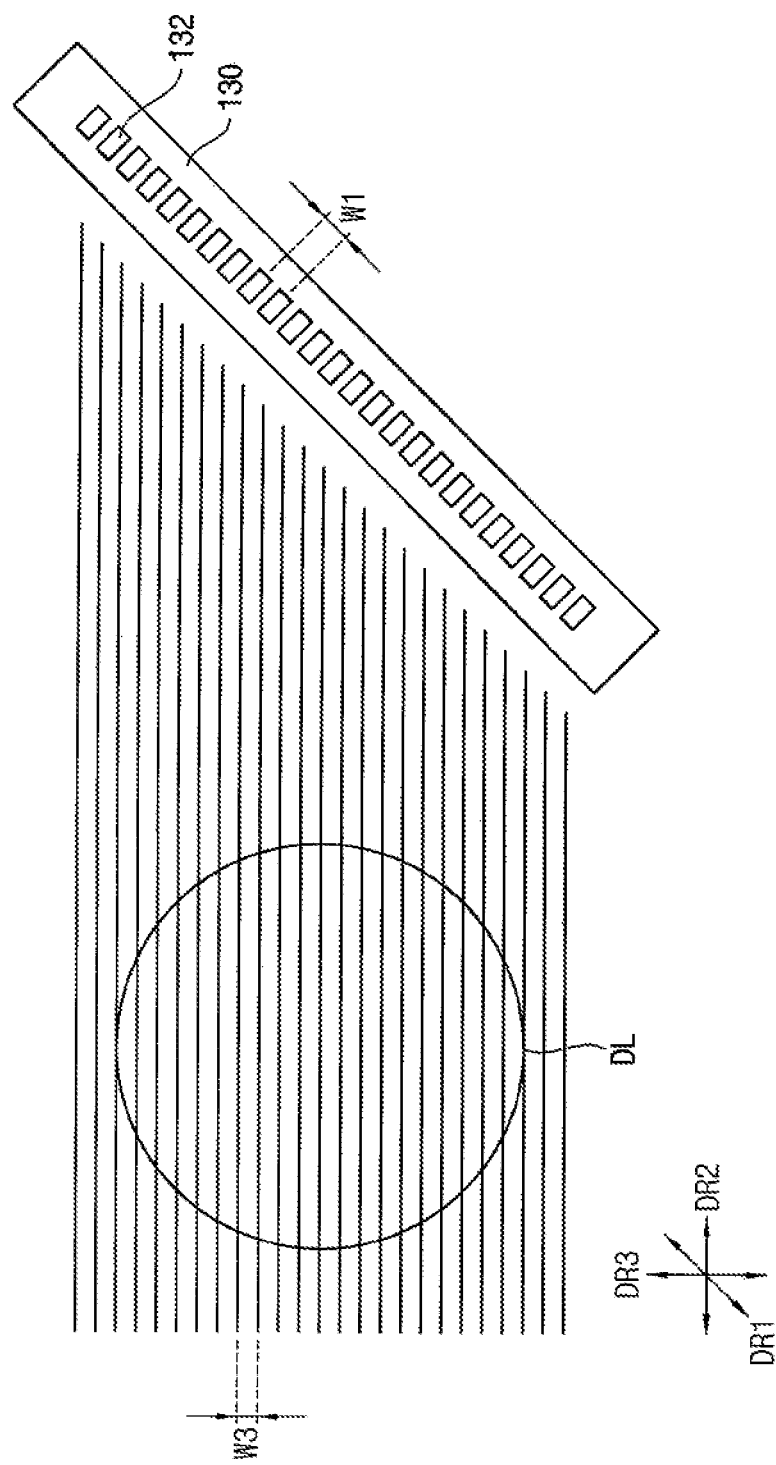
FIG. 13 is a view showing scanning of the droplet according to an example embodiment of the present disclosure.

FIG. 13 is a view showing scanning of the droplet (S120), according to an example embodiment of the present disclosure.

Referring to FIGS. 3 and 13, in the step of scanning the droplet (S120), the scanning unit 130 may be moved in the second direction DR2. Additionally, the optical scanners 132 arranged in the first direction DR1 may emit the light to the droplets DL, receive the light reflected from the surfaces of droplets DL, and measure the thicknesses of the portions of the droplet DL by using the reflected light.

In an example embodiment, the optical scanners 132 of the scanning unit 130 may be arranged in the first direction DR1, which forms an angle with respect to the second direction DR2, and the interval W1 between the adjacent optical scanners 132 may be about 5 μm. When the angle between the first direction DR1 and the second direction DR2 is about 60 degrees, the scanning interval W3 in the third direction DR3 which is substantially orthogonal to the second direction DR2 may be about 2.5 μm, and the scanning resolution in the third direction DR3 may be about 28 when the diameter of the droplet DL is about 70 μm. In other words, about 28 optical scanners 132 may scan one droplet DL. In addition, the scanning unit 130 may move in the second direction DR2, and the scanning interval in the second direction DR2 may be about 250 nm. In this case, the scanning resolution in the second direction DR2 may be about 280 when the diameter of the droplet DL is about 70 μm. In other words, each of the optical scanners 132 may scan one droplet DL about 280 times. Accordingly, in an embodiment of the present disclosure, the optical scanners 132 may scan one droplet DL at a scanning resolution of about 7840. Therefore, the scanning unit 130 may measure thicknesses of about 7840 portions of the droplet DL.

When compared to an example embodiment of the present disclosure described with reference to FIG. 8, in an example embodiment of the present disclosure described with reference to FIG. 13, the first direction DR1 forms an angle with respect to the second direction DR2 in which the scanning unit 130 moves. The optical scanners 132 of the scanning unit 130 may be arranged the first direction DR1. As a result, the scanning interval W3 of the scanning unit 130 in the third direction DR3, which is substantially orthogonal to the second direction DR2, may be reduced. Therefore, the scanning resolution of the scanning unit 130 may be increased, so that the volume of the droplet DL may be measured more accurately.

Hereinafter, a method of manufacturing a display device, according to an example embodiment of the present disclosure, will be described with reference to FIGS. 14 to 17. The method of manufacturing a display device may include the droplet measurement method described with reference to FIGS. 1 to 13. Accordingly, descriptions of contents substantially identical or similar to the contents described above will be omitted.

Figure 14:
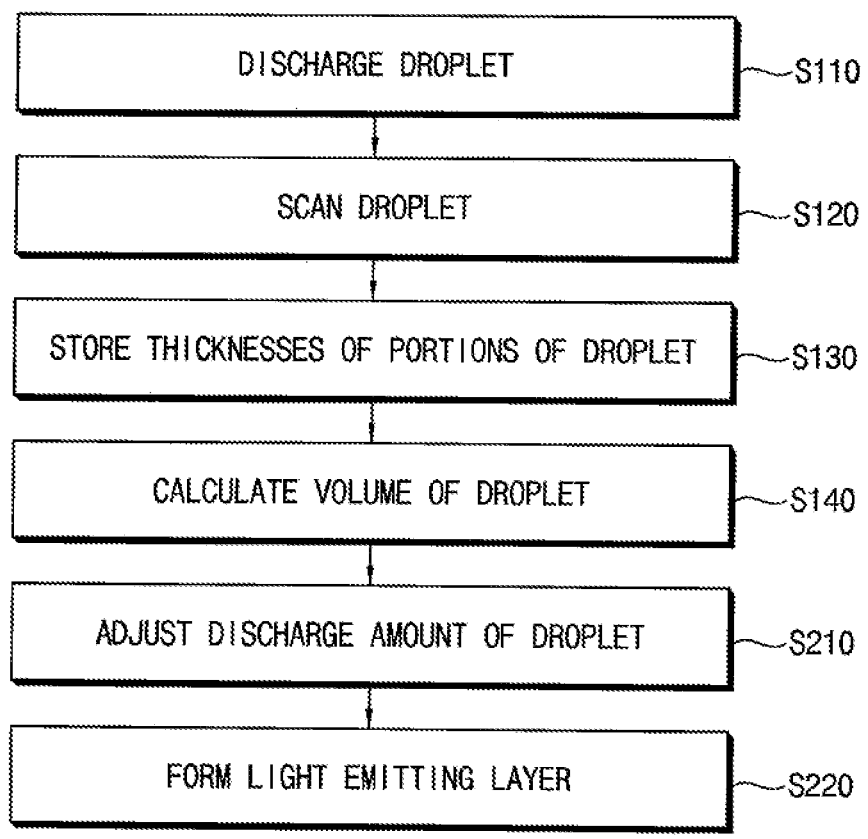
FIG. 14 is a flowchart showing a method of manufacturing a display device according to an example embodiment of the present disclosure.

FIG. 14 is a flowchart showing a method of manufacturing a display device, according to an example embodiment of the present disclosure.

Referring to FIG. 14, the method of manufacturing the display device, according to an example embodiment of the present disclosure may include discharging a droplet (S110), scanning the droplet (S120), storing one or more thicknesses of portions of the droplet (S130), calculating a volume of the droplet (S140), adjusting a discharge amount of the droplet (S210), and forming a light-emitting layer (S220).

Figure 15:
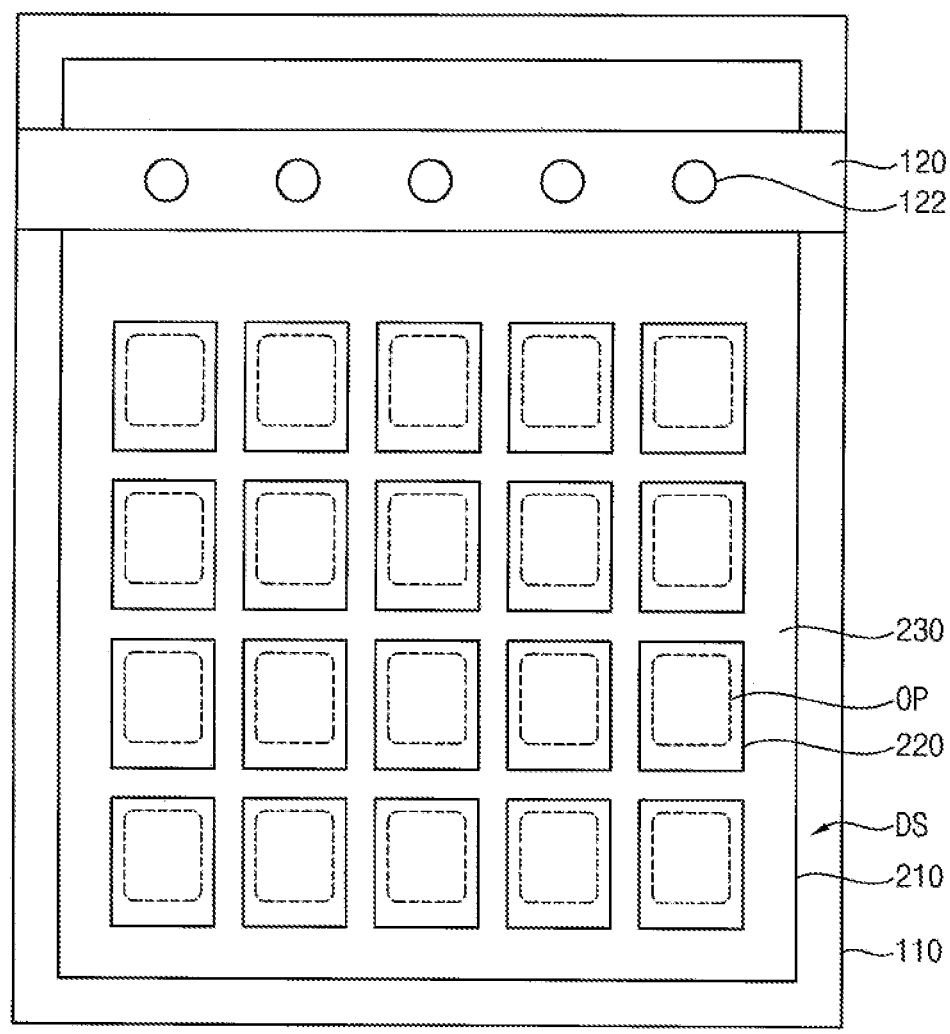
FIG. 15 is a plan view showing a display substrate, which is disposed on a stage, according to an example embodiment of the present disclosure.
Figure 15:
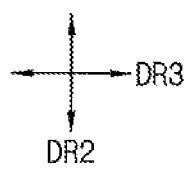

FIG. 15 is a plan view showing a display substrate, which is disposed on a stage, according to an example embodiment of the present disclosure.

Referring to FIGS. 14 and 15, in the adjusting of the discharge amount of the droplet (S210), the discharge amount of the droplet discharged from the droplet discharge unit 120 to a display substrate DS may be adjusted in consideration of the volume of the droplet calculated by the calculation unit. The discharge amount of the droplet may be reduced when the calculated volume of the droplet is larger than a predetermined volume of the droplet, and the discharge amount of the droplet may be increased when the calculated volume of the droplet is smaller than the predetermined volume of the droplet.

The display substrate DS may include a plurality of pixel electrodes 220 disposed on a transistor substrate 210, and a pixel defining layer 230 disposed on the pixel electrodes 220. The transistor substrate 210 may include a plurality of transistors configured to provide a driving current to the pixel electrodes 220. The pixel defining layer 230 may include openings OP that expose at least a portion of each of the pixel electrodes 220. In a case where discharge amounts of the droplets are nonuniform as compared with each other, there may be a height difference between light-emitting layers formed by the droplets. In this case, the droplets may be respectively discharged to the pixel electrodes 220 exposed by the openings OP of the pixel defining layer 230. As a result, the height difference between the light-emitting layers may be recognized as a stain of the display device.

Accordingly, when the discharge amounts of the droplets respectively discharged from the nozzles 122 of the droplet discharge unit 120 are nonuniform as compared with each other, the discharge amounts of the droplets discharged from the nozzles 122 may be adjusted so as to be uniform as compared to each other by adjusting the discharge amount of the droplet for each nozzle 122.

Figure 16:
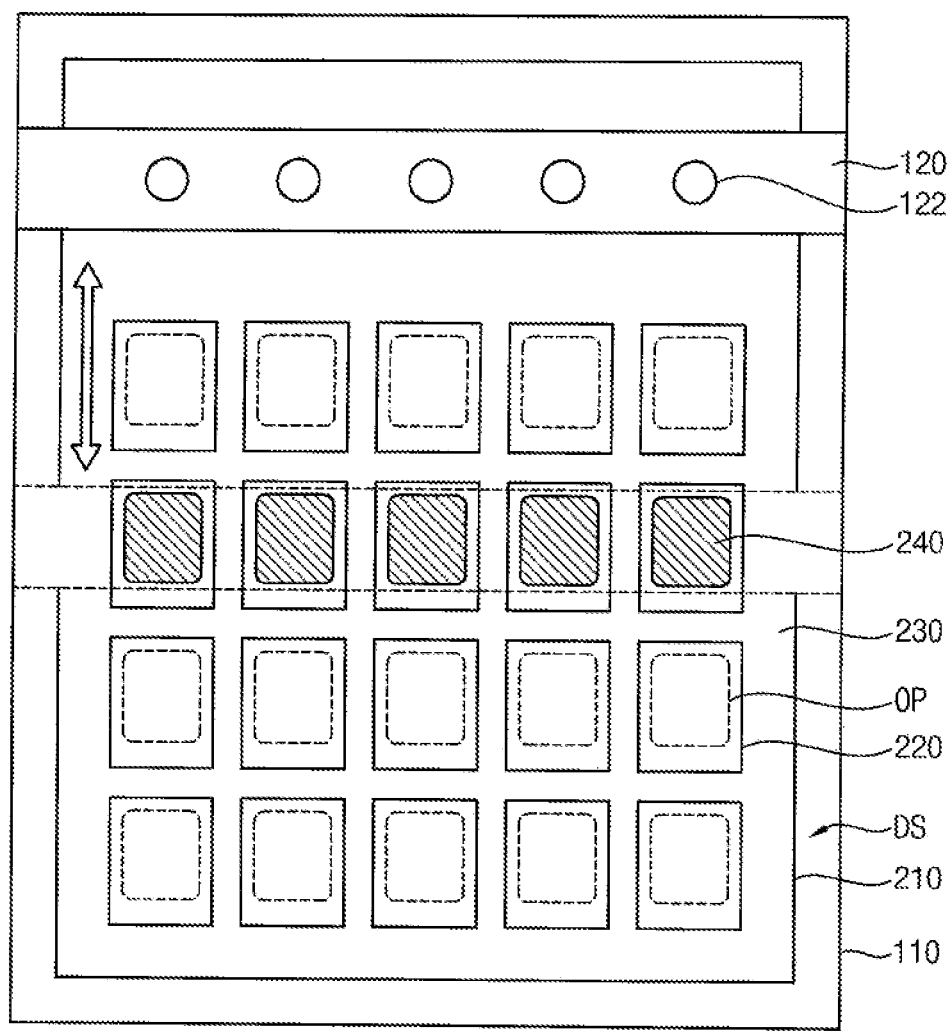
FIGS. 16 and 17 are views showing the formation of a light-emitting layer according to an example embodiment of the present disclosure.
Figure 17:
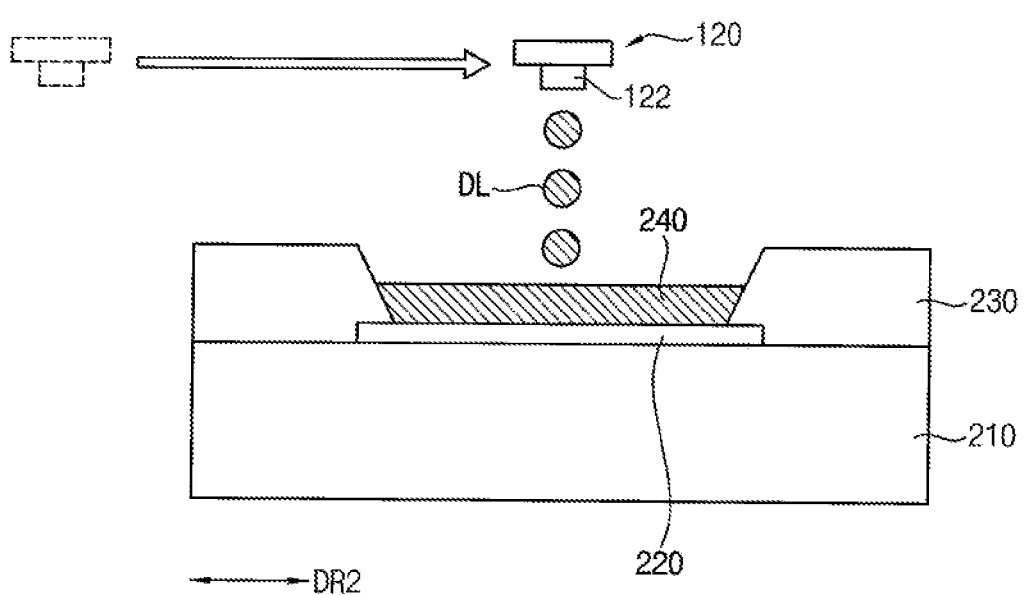

FIGS. 16 and 17 are views showing forming of a light-emitting layer (S220), according to an example embodiment of the present disclosure.

Referring to FIGS. 14, 16, and 17, in the step of forming the light-emitting layer (S220), a light-emitting layer 240 may be formed by discharging the droplet DL onto the display substrate DS. The display substrate DS may be disposed on the stage 110. The droplet discharge unit 120 may be moved in the second direction DR2 so the droplet discharge unit 120 may be disposed on the pixel electrodes 220, where the pixel electrodes 220 are arranged in the third direction DR3. The droplet discharge unit 120 may include the nozzles 122 arranged in the third direction DR3. Light-emitting layers 240 may then be arranged in the third direction DR3 and may be formed by discharging the droplets DL through the nozzles 122 on the pixel electrodes 220. The pixel electrodes 220 may be respectively exposed by the openings OP of the pixel defining layer 230.

In an example embodiment, the droplet DL may include at least one of a hole injection material, a hole transport material, an organic light-emitting material, an electron transport material, and an electron injection material. The organic light-emitting material may include a red organic light-emitting material, a green organic light-emitting material, and/or a blue organic light-emitting material. The droplet DL may include a solvent for allowing the materials to be smoothly discharged from the nozzle 122 in addition to the materials.

In an example embodiment of the present disclosure, the volume of the droplet DL is calculated by using the thicknesses of the portions of the droplet DL scanned by the scanning unit so the volume of the droplet may be measured accurately. The discharge amount of the droplet DL may be adjusted based on the accurately measured volume of the droplet DL so the light-emitting layers 240 of the display device, which have a uniform volume, may be formed. Accordingly, a stain on the display device may be prevented from being recognized.

The droplet measurement method, the droplet measurement apparatus, and the method of manufacturing the display device, according to the embodiments of the present disclosure, may be applied to a method of manufacturing a display device included in a computer, a notebook, a mobile phone, a smartphone, a smart pad, a PMP, a PDA, an MP3 player, or the like.

Although the droplet measurement method, the droplet measurement apparatus, and the method of manufacturing the display device according to the embodiments have been described with reference to the drawings, the illustrated embodiments are examples, and may be modified and changed by a person with ordinary knowledge in the relevant technical field without departing from the technical spirit described in the following claims.

What is claimed is:

1. A droplet measurement method comprising:
discharging a droplet on a substrate;
scanning the droplet by moving a scanning unit, which includes optical scanners arranged in a first direction, in a second direction different from the first direction;
storing one or more thicknesses of portions of the droplet scanned by the scanning unit; and
calculating a volume of the droplet based on the one or more thicknesses of the portions of the droplet,
wherein the calculating of the volume of the droplet includes:
calculating a plurality of sectional areas of the droplet along the second direction through a mensuration by parts by using the one or more thicknesses of the portions of the droplet, which are arranged in the first direction; and
calculating the volume of the droplet through the mensuration by parts by using the plurality of sectional areas of the droplet, which are arranged in the second direction.

2. The droplet measurement method of claim 1, wherein the scanning of the droplet includes:
emitting light to the droplet by each of the optical scanners; and
measuring the one or more thicknesses of the portions of the droplet by receiving the light reflected from the droplet by each of the optical scanners.

3. The droplet measurement method of claim 1, wherein the first direction is orthogonal to the second direction.

4. The droplet measurement method of claim 1, wherein the first direction forms an acute angle with respect to the second direction.

5. The droplet measurement method of claim 4, wherein an angle between the first direction and the second direction is 5 degrees or more and less than 90 degrees.

6. The droplet measurement method of claim 1, wherein a scanning resolution of the scanning unit in the second direction is adjusted by a moving speed of the scanning unit in the second direction and a scanning frequency of the scanning unit.

7. A droplet measurement apparatus comprising:
a stage configured to support a substrate;
a droplet discharge unit disposed on the stage to discharge a droplet on the substrate;
a scanning unit disposed on the stage and including optical scanners arranged in a first direction to scan the droplet while moving in a second direction different from the first direction, wherein an interval between adjacent optical scanners in the first direction smaller than a diameter of a droplet;
a storage unit configured to store one or more thicknesses of portions of the droplet scanned by the scanning unit; and
a calculation unit configured to calculate a volume of the droplet based on the one or more thicknesses of the portions of the droplet.

8. The droplet measurement apparatus of claim 7, wherein the first direction is orthogonal to the second direction.

9. The droplet measurement apparatus of claim 7, wherein the first direction forms an acute angle with respect to the second direction.

10. The droplet measurement apparatus of claim 9, wherein an angle between the first direction and the second direction is 5 degrees or more and less than 90 degrees.

11. The droplet measurement apparatus of claim 7, wherein the interval between adjacent optical scanners of the scanning unit is uniform.

12. The droplet measurement apparatus of claim 7, wherein each of the optical scanners includes:
a light source configured to emit light to the droplet; and
an optical sensor configured to receive the light reflected from the droplet.

13. The droplet measurement apparatus of claim 7, wherein the droplet discharge unit moves in the second direction to discharge the droplet.

14. The droplet measurement apparatus of claim 7, wherein the droplet discharge unit includes nozzles arranged in a third direction orthogonal to the second direction to respectively discharge the droplet.

15. A method of manufacturing a display device, the method comprising:
discharging a droplet on a substrate;
scanning the droplet by moving a scanning unit, which includes optical scanners arranged in a first direction, in a second direction different from the first direction;
storing one or more thicknesses of portions of the droplet scanned by the scanning unit;
calculating a volume of the droplet based on the one or more thicknesses of the portions of the droplet, wherein the calculating of the volume of the droplet includes:
calculating a plurality of sectional areas of the droplet along the second direction through a mensuration by parts by using the one or more thicknesses of the portions of the droplet, which are arranged in the first direction; and
calculating the volume of the droplet through the mensuration by parts by using the plurality of sectional areas of the droplet, which are arranged in the second direction;
adjusting a discharge amount of the droplet; and
forming a light-emitting layer by discharging the droplet onto a display substrate.

16. The method of claim 15, wherein the scanning of the droplet includes:
emitting light to the droplet by each of the optical scanners; and
measuring the one or more thicknesses of the portions of the droplet by receiving the light reflected from the droplet by each of the optical scanners.

17. The method of claim 15, wherein the droplet includes at least one of a hole injection material, a hole transport material, an organic light-emitting material, an electron transport material, and an electron injection material.

18. The method of claim 15, wherein the display substrate includes a pixel electrode and a pixel defining layer including an opening formed on the pixel electrode to expose at least a portion of the pixel electrode, and
the droplet is discharged in the opening on the pixel electrode.

* * * * *